(12) United States Patent
McNeely

(10) Patent No.: US 6,317,167 B1
(45) Date of Patent: Nov. 13, 2001

(54) SINE X/X COMPENSATION CIRCUITRY MERGED WITH A DIGITAL MODULATOR

(75) Inventor: David Lowell McNeely, Indianapolis, IN (US)

(73) Assignee: Thomson Licensing S.A., Boulogne-Cedex (FR)

( * ) Notice: Subject to any disclaimer, the term of this patent is extended or adjusted under 35 U.S.C. 154(b) by 0 days.

(21) Appl. No.: 09/382,235

(22) Filed: Aug. 24, 1999

(51) Int. Cl.[7] .................................................. H04N 5/40
(52) U.S. Cl. ............................................ 348/724; 348/723
(58) Field of Search ........................... 341/144; 348/724, 348/723, 642; H04N 5/40, 5/38, 9/65

(56) References Cited

U.S. PATENT DOCUMENTS

| 5,208,596 | 5/1993 | Dieterich | 341/144 |
| 5,844,629 | * 12/1998 | Murray | 348/642 |

FOREIGN PATENT DOCUMENTS

| 1-93211 | 4/1989 | (JP) | H03H/17/02 |
| 63-252017 | 10/1988 | (JP) | H03M/1/66 |

OTHER PUBLICATIONS

Ray Hauge et al., ATSC VSB RE–MODULATOR SYSTEM, IEEE Transactions on Consumer Electronics, vol. 44, No. 3, Aug., 1998, pp. 823–826.

* cited by examiner

Primary Examiner—Sherrie Hsia
(74) Attorney, Agent, or Firm—J. S. Tripoli; E. P. Herrmann

(57) ABSTRACT

Digital remodulation systems typically include digital to analog converters which have an inherent undesirable sin (x)/x frequency response. Digital remodulated signals are typically high frequency and thus not conducive to sin(x)/x pre-correction prior to digital to analog conversion. Described herein is apparatus and a method for pre-correcting the sin(x)/x roll off of the digital to analog converter in the digital signal path prior to the digital modulator which precedes the digital to analog converter. This apparatus corresponds to a cascading of spectrally symmetric and anti-symmetric transversal filters designed to compensate a relatively small portion of the frequency response of the resulting analog signal.

16 Claims, 11 Drawing Sheets

SINE X/X COMPENSATION CIRCUITRY MERGED WITH A DIGITAL MODULATOR

BACKGROUND

1. Field of the Invention

The present invention relates to various approaches for processing an ongoing stream of digital samples which, when employed together, are suitable for use in a vestigial-sideband (VSB) digital modulator that derives a 6 MHz bandwidth input signal selectively centered either at 63 MHz (Channel 3), 69 MHz (Channel 4) or 5.38 MHz IF (baseband) for a television receiver and, more particularly, for a high-definition television (HDTV) receiver. Related applications filed concurrently herewith are COMPLEX MODULATOR CARRIER SIGNAL GENERATOR Sn. (09/382,234); A PULSE CODE MODULATED TO DC CENTERED VSB CONVERTER 09/382,232, U.S. Pat. No. 6,229,464; and VSB DIGITAL MODULATOR 09/382,231.

D/A Converters input a discrete sequence of digital sample values and output analog values. The analog value corresponding to a single input digital value is maintained for the interval between input sample values. In the sample data digital domain the impulse train of discrete values in time has a periodic frequency spectrum. The D/A "hold" operation modifies the periodic spectrum by multiplication with a $\sin(\pi \cdot f/fs)/(\pi \cdot f/fs)$ {termed $\sin(x)/x$}, where f is the analog frequency in Hz and fs is the digital sample rate in samples per second. The $\sin(x)/x$ frequency response is not periodic and is defined on the interval $\omega \epsilon(-\infty\infty)$.

In conventional applications the $\sin(x)/x$ frequency characteristic of the D/A is compensated with a fixed coefficient pre-filter with $x/\sin(x)$ frequency response in the interval $f\epsilon(-fs/2, fs/2)$. This pre-filter is often packaged with the D/A. Note that frequencies outside this interval are not compensated correctly.

The present invention addresses sinx/x correction in the context of Direct Digital Synthesis of RF modulated signals (esp. 8/16 VSB modulated carriers of the US HDTV Standard) wherein:

1. The desired RF image may or may not be in the first nyquist region, (–fs/2, fs/2) of the D/A converter, and the desired image contains a selected TV channel band for transmission.
2. The lowest sample rate of interest in the system is the symbol rate of the digital modulation, which determines the information bandwidth.
3. The highest sample rate in the system is the D/A output rate. This will be typically at N times the symbol rate.
4. It is only necessary to compensate the band to be transmitted and therefore $\sin(x)/x$ compensation may be performed as early in the transmission chain as the band is resolvable. For VSB modulation this can be done at the symbol rate, and hence before, or after sample rate conversion, and/or before or after up modulation.
5. Correction can be performed with real or complex filtering depending on its carrier frequency at the point of correction.

For the HDTV signal, correction is performed at a point in the modulator where the data is complex with carrier frequency of 0, which necessitates complex filtering.

2. Description of the Prior Art

Reference is further made to U.S. Pat. No. 5,208,596, entitled "DAC Distortion Compensation", which issued May 4, 1993 to Charles B. Dietrich and is assigned to the same assignee as the present application. The teaching of this patent is representative of a prior-art approach to compensating for the inherent sin x/x roll-off in the analog output magnitude of a digital-to-analog (D/A) converter as a function of frequency.

SUMMARY OF THE INVENTION

The present invention is directed to circuitry for compensating the inherent sin x/x transfer function of a digital to analog converter in a television signal modulation system. More particularly it is directed to digital circuitry for compensating a relatively narrow band portion of a wideband modulated signal. The general configuration of the compensating circuitry is a transversal filter having the characteristics of cascaded spectrally symmetric and anti-symmetric transversal filters.

DESCRIPTION OF THE PREFERRED EMBODIMENTS

It is pointed out at the onset, that the term "DC centered" refers to centering about a zero Hz frequency and not about a DC amplitude. Typically in this description, it is in reference to a signal modulation bandwidth which is centered on DC.

Figure 1:
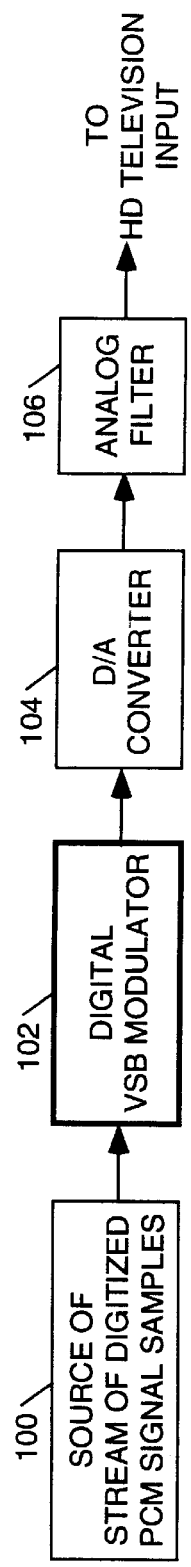
FIG. 1 is a functional block diagram of apparatus, including a VSB digital modulator for deriving an input signal to an HDTV from a stream of digitized PCM samples forwarded as an input to the modulator from a source of the stream.

Referring to FIG. 1, there is shown (1) source of stream of digitized pulse-code-modulation (PCM) signal samples 100, (2) digital VSB modulator 102, (3) D/A converter 104 and (4) analog filter 106. Source 100 includes the digital product from which initial signal information is obtained together with digital processing means, if any, required to add additional desired signal information and/or to modify the form of the signal information to thereby derive the sample-stream output from source 100 that is applied as an input to digital VSB modulator 102. Preferred embodiments of digital VSB modulator 102, which incorporate features of the present invention, are described in detail below. In any event, the digital output from digital VSB modulator 102 comprises a stream of modulated data samples occurring at a given relatively high sample-frequency rate, which, after being converted to an analog signal by D/A converter 104, gives rise selectively to a Channel 3, Channel 4 or IF baseband signal centered at 5.38 MHz. After being converted to an analog signal by D/A converter 104, any resulting undesired frequency components lying outside of a frequency bandwidth above the given sample-frequency rate is removed by analog filter 106.

Figure 2:
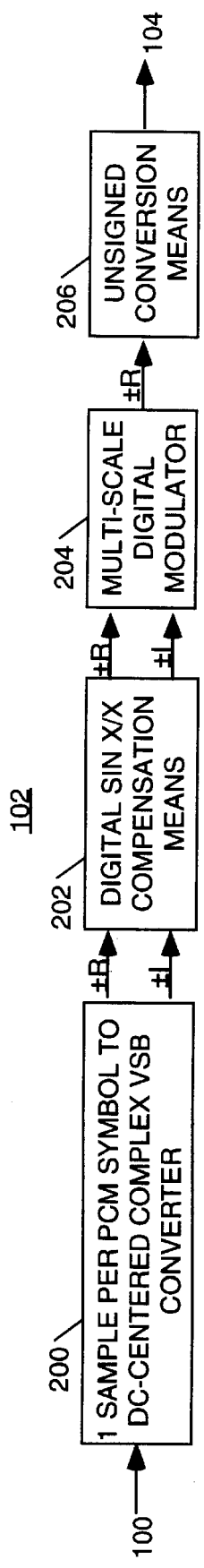
FIG. 2 is a functional block diagram of the components of the VSB digital modulator shown in FIG. 1.

As shown in FIG. 2, digital VSB modulator 102 comprises 1 sample per PCM symbol to DC-centered complex VSB converter 200 (which is described in detail below in connection with FIGS. 3–7), digital sin x/x compensation means (which is described in detail below in connection with in FIGS. 12–18), multi-scale digital modulator 204 (which is described in detail below in connection with FIGS. 8–11) and unsigned conversion means 206 (which is described in detail below).

The stream of signal PCM samples from source 100 is applied as an input to VSB converter 200, which derives 2 VSB output streams in signed real (R) and imaginary (I) complex form that are applied as inputs to sin x/x compensation means 202. The 2 output streams from sin x/x compensation means 202, still in signed complex form, are applied as inputs to multi-scale digital modulator 204, which derives a single output stream in signed R form that is forwarded as an input to D/A converter 104 through unsigned conversion means 206 (i.e., the operation performed by unsigned conversion means 206 is to add the same given positive (±) magnitude value to the signed (+) magnitude value of each symbol of the single output stream, wherein the given positive magnitude value is sufficient to result in the sum magnitude value of each symbol of the output stream from unsigned conversion means 206 being positive and, therefore, all symbol samples applied as an input to D/A converter 104 have only positive values).

For illustrative purposes in describing a preferred embodiment of the present invention it is assumed that (1) each of the stream of PCM symbol samples applied as an input to VSB converter 200 comprises 4 bits defining a 3 bit (8VSB) or 4 bit (16VSB) real data occurring at a sample-frequency clock rate of 10.76 MHz; (2) each of VSB converter 200 and digital sin x/x compensation means operate at a sample-frequency clock rate of 10.76 MHz and (3) the input, and output sample-frequency clock rates of multi-scale digital modulator 204 are, respectively, 10.76 MHz and 86.08 MHz (i.e., 8 times 10.76 MHz), while the operating sample-frequency clock rate of multi-scale digital modulator 204 may also include at least one sub-harmonic of 86.08 MHz intermediate 10.76 MHz and 86.08 MHz in addition to 10.76 MHz and 86.08 MHz.

Figure 3:
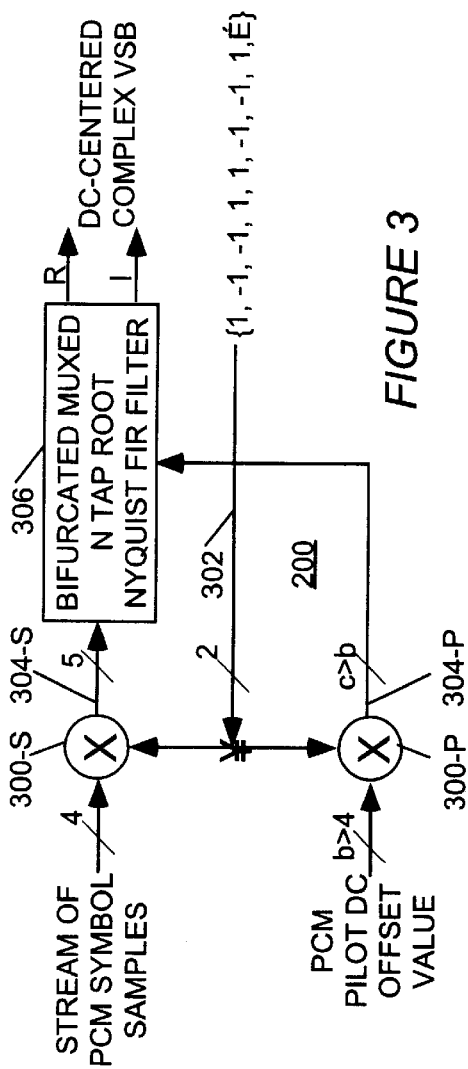
FIG. 3 diagrammatically shows a preferred embodiment of the 1 sample per PCM symbol to DC-centered VSB converter shown in FIG. 2 and FIG. 4 schematically shows the details of the bifurcated muxed N tap root Nyquist FIR filter shown in FIG. 3.

Referring now to FIG. 3, in addition to the aforesaid stream of 4-bit PCM symbol samples applied as an input to VSB converter 200, VSB converter 200 also has a more precise PCM pilot DC value, defined by b>4 bits, available to it for adjusting a pilot-tone amplitude to its desired level. This b>4 bit PCM pilot DC value is applied as a modulating signal to modulator 300-P, while each 4 bit PCM symbol sample of the stream is applied as a modulating signal to modulator 300-S. An ongoing stream 302, occurring at the 10.76 MHz sample-frequency rate, of a repeated 4-bit sequence composed of the digital sign values {1, −1, −1, 1}, is applied as a DC-centered carrier to both modulators 300-P and 300-S. This ongoing stream 302, which is {1, −1, −1, 1, 1, −1, −1, 1, 1 . . . } of samples, can be considered to define the quadrant values of each successive cycle of the function $\cos(n\pi/2)\cdot\sin(n\pi/2)=1.414*\cos(\pi*n/2+\pi/4)$, where 1.414 is a rational approximation of 2½ and n=symbol index. Thus, the modulated pilot output stream 304-P from modulator 300-P and the modulated data signal output stream 304-S from modulator 300-S constitute real signals that are used to define complex signals in coded form; that is such a real signal comprises an ongoing symbol-modulated sinusoidal wave sampled at each quadrant of each cycle thereof, wherein the real "cos" component comprises ± signed non-zero values that without decoding constitute the ± signed non-zero valued R component of the corresponding complex signal, but the real "sin" component comprises zero values that in coded form constitute the zero-valued ±I component of the corresponding complex signal. Therefore, both modulated pilot output stream 304-P and the modulated data signal output stream 304-S, which are applied as inputs to bifurcated muxed N-tap root Nyquist FIR (finite impulse response) filter 306, are real DC-centered signals comprising only 1 sample per symbol. However, as indicated in FIG. 3, filter 306 derives an output comprising an ongoing stream of complex DC-centered VSB symbol samples in which both the ±R and ±I components have non-zero values.

Figure 4:
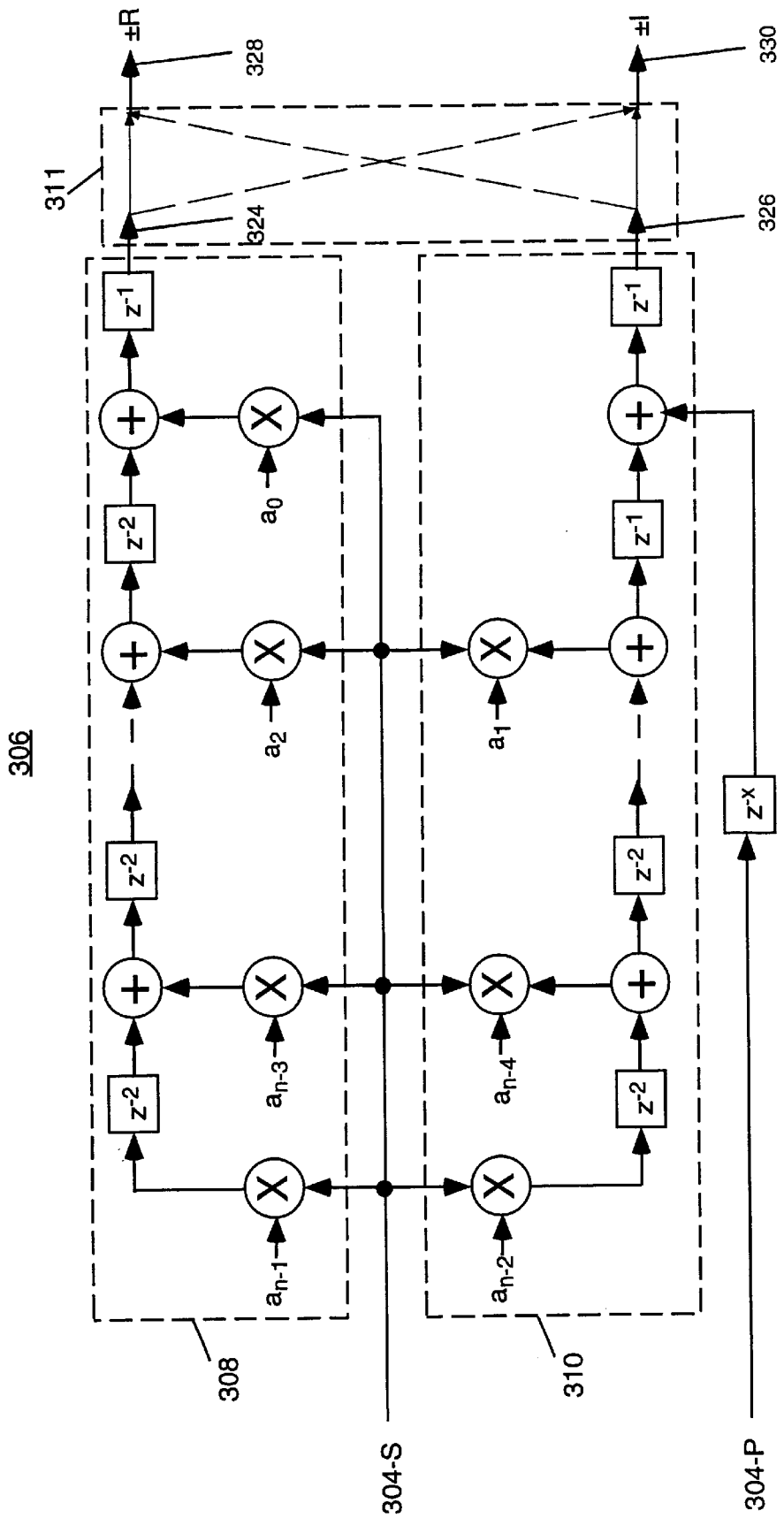

More particularly, N-tap filter 306 is a single filter having an odd number of taps (e.g., 55 taps for example). However, as shown in FIG. 4, N-tap filter 306 is organized into first input-weighted (N+1)/2-tap FIR sub-filter 308 (i.e., a 28-tap sub-filter for example), second input-weighted (N−1)/2-tap FIR sub-filter 310 (i.e., a 27-tap sub-filter for example) and multiplexer (mux) 311. First sub-filter 308 comprises all the even-numbered taps 0, 2, 4, . . . . (N−3) and (N−1) of N-tap filter 306, while second sub-filter 310 comprises all the odd-numbered taps 1, 3, 5, . . . (N−4) and (N−2) of N-tap filter 306 where the $\alpha_i$ correspond to weighting coefficients selected to produce the desired transfer function and the respective $z^{-j}$ correspond to "j" sample delays. However, as indicated in FIG. 4, data output streams 324 and 326 from sub-filters 308 and 310 are applied as data input streams to mux 311, which toggles each sample period at the sample-frequency clock rate of 10.76 MHz to (1) connect data output stream 324 from sub-filter 308 to ±R data output stream 328 during each odd sample period and to ±I data output stream 330 during each even sample period and (2) connect data output stream 326 from sub-filter 310 to ±I data output stream 330 during each odd sample period and to ±R data output stream 328 during each even sample period. Therefore, the relative relationships between the ±I samples of data output stream 330 as a function of successive sample periods and the ±R samples of output 328 as a function of successive sample periods are as follows:

TABLE 1

| Sample Periods | 1 | 2 | 3 | 4 | 5 | . . . |
|---|---|---|---|---|---|---|
| Output 328 | R | −R | −R | R | R | . . . |
| Output 330 | −I | −I | I | I | −I | . . . |

Figure 5:
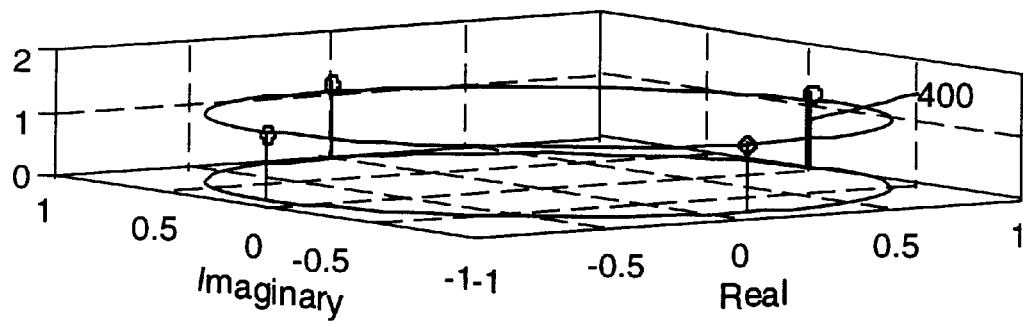
FIGS. 5, 6 and 7, together, graphically show the manner by which the operation of the bifurcated muxed N tap root Nyquist FIR filter shown in FIG. 4 generates the VSB converter output.
Figure 6:
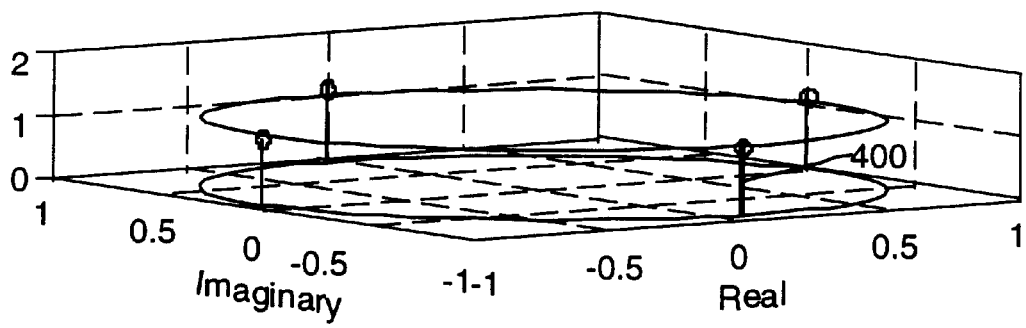
Figure 7:
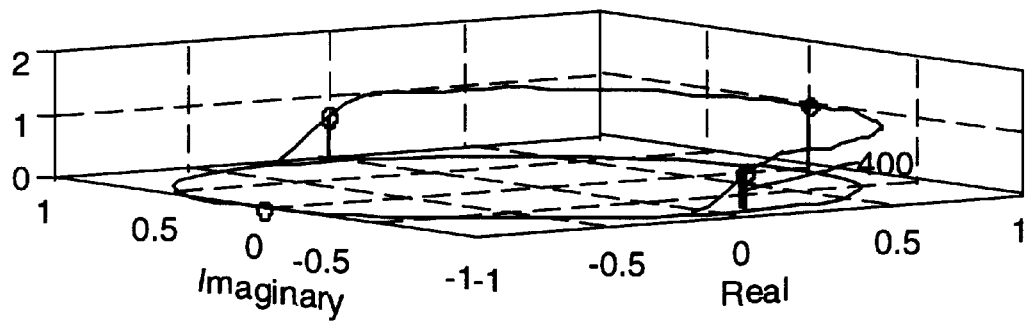

Reference is now made to FIGS. 5, 6 and 7. FIG. 5 shows the relationship in the Z domain of the normalized magnitude value 1 of each of successive samples in the sample-stream output 324 from first sub-filter 308 as a function of the location of that sample in the real-imaginary plane (where thickened line 400 represents the location of the output 324 sample during sample period 1 of Table 1). FIG. 6 shows the relationship in the Z domain of the normalized magnitude value 1 of each of successive samples in the sample-stream output 326 from second sub-filter 310 as a function of the location of that sample in the real-imaginary plane (where thickened line 400 now represents the location of the output 326 sample during sample period 1 of Table 1). By comparing FIG. 6 to FIG. 5, it is apparent that FIG. 6 represents a ¼ sequence-cycle rotation in the clockwise direction of FIG. 5. The operation of mux 311 effectively sums the sample-stream output 324 from first sub-filter 308 and the sample-stream output 326 from second sub-filter 310. FIG. 7, which shows the relationship in the Z domain of the normalized magnitude value of each of successive samples in the sample-stream of this sum (as represented by outputs 328 and 330 of Table 1). As indicated in FIG. 7, the normalized magnitude value of 1 in the first ¼ of a sequence-cycle and fourth ¼ of a sequence-cycle drops to a normalized magnitude value of 0 in the second ¼ of a sequence-cycle and third ¼ of a sequence-cycle. The result is that the upper VSB signal energy is captured, while the lower sideband energy is removed. Thus, the real output 328 and imaginary output 330 shown in FIG. 4 constitute the DC-centered complex VSB output of filter 306 shown in FIG. 3.

The above-described 1 sample per PCM symbol to DC-centered VSB converter with pilot tone amplitude control is significantly less complex and costly to implement in hardware than the conventional 2 sample per PCM symbol to DC-centered VSB converter with pilot tone amplitude control. First, the need for only 1 sample per PCM symbol rather than 2 sample per PCM symbol reduces hardware implementation by 50%. Second, the use of real modulators 300-S and 300-P, rather than complex modulators, further reduces hardware implementation. Third, the use of a single bifurcated real n-tap filter, rather than the use of two (i.e., complex real and imaginary) n-tap filters provides an additional 50% savings in filter hardware. Fourth, the use of a single bifurcated real n-tap filter allows a unique pilot amplitude control method that provides an additional 35% savings in hardware. Fifth, the fact that no complex math is required to generate a complex output from the -described 1 sample per PCM symbol to DC-centered VSB converter further reduces implementation hardware.

Returning to FIG. 2, it will be seen that, in the preferred embodiment of the invention, digital sin x/x compensation means is situated between the DC-centered complex VSB sample-stream output from VSB converter 200, that occurs at a 10.76 MHz sample-frequency rate, and the input to multi-scale digital modulator 204. This is because it is better to implement digital sin x/x compensation at a lower 10.76 MHz sample-frequency rate than at a higher sample-frequency rate because higher sample-frequency rates have negatives of generally higher dissipation, higher current, as well as producing more undesirable electromagnetic interference (EMI). However, in accordance with the scope of the present invention, digital sin x/x compensation may be performed at any sample frequency rate in the system (including 86.08 MHz) prior to any actual modulation of the complex ±R and ±I data sample-streams on a carrier in multi-scale digital modulator 204. Therefore, multi-scale digital modulator 204 will be described in detail before sin x/x compensation means 202 is described in detail.

Multi-scale digital modulator 204, in response to 1 sample per symbol ±R and ±I streams applied as inputs thereto occurring at sample-frequency rates of 10.76 MHz, selectively derives, as a user-controlled modulated output, (1) a signed 8 sample per symbol ±R stream centered at a relatively low pseudo-carrier frequency of −23.08 MHz, (2) a signed 8 sample per symbol R stream centered at a still lower pseudo-carrier frequency of −17.08 MHz, or (3) a signed 8 sample per symbol ±R stream centered at a very low carrier frequency of 5.38 MHz, all of which output streams occur at a sample-frequency rate of 86.08 MHz. The −23.08 MHz digital output stream, after conversion to analog by unsigned conversion means 206 and D/A converter 104, results in both an undesired symbol-stream modulated 23.08 MHz analog signal and a desired symbol-stream modulated 63 MHz (Channel 3) analog image signal (i.e., 63 MHz= (86.08−23.08) MHz). Similarly, the −17.08 MHz digital output stream results in both an undesired symbol-stream modulated 17.08 MHz analog signal and a desired symbol-stream modulated 69 MHz (Channel 4) analog image signal (i.e., 69 MHz=(86.08−17.08) MHz). The 5.38 MHz digital output stream results directly in a desired symbol-stream modulated 5.38 MHz analog signal.

Figure 8:
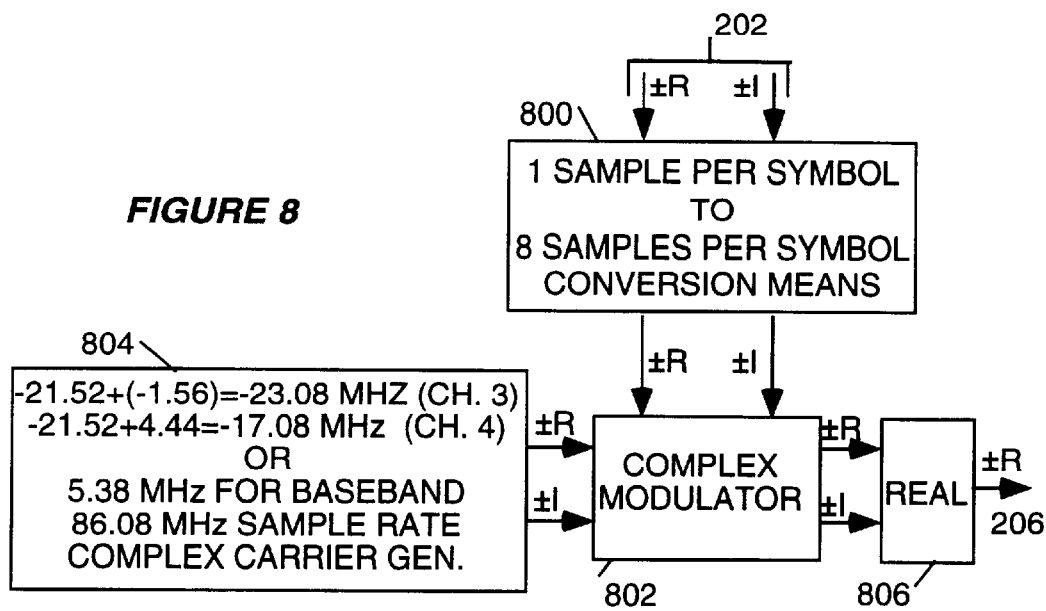
FIG. 8 shows an embodiment of the multi-scale digital modulator of FIG. 2 employing a design approach for deriving, at a predetermined sampling-frequency rate, streams of sample values defining respective data-modulated carrier frequencies for Channel 3, Channel 4 and baseband.

An exemplary multi-scale digital modulator 204, is shown in FIG. 8, where 1 sample per symbol to 8 samples per symbol conversion means 800, operating at an 86.08 MHz sample-frequency rate, has each of the complex ±R and ±I input streams from sin x/x compensation means 202 applied as inputs thereto and each of the as yet unmodulated data-symbol valued complex ±R and ±I output streams therefrom applied as the modulating inputs to complex modulator 802. Complex carrier generator 804, operating at an 86.08 MHz sample-frequency rate, derives complex ±R and ±I carrier-output streams that selectively define the sample values of a constant-magnitude −23.08 MHz pseudo-carrier (produced by the complex product of constant magnitude −21.52 and −1.56 MHz frequencies) for Channel 3, the sample values of a constant magnitude −17.08 MHz pseudo-carrier (produced by the complex product of constant magnitude −21.52 and 4.44 MHz frequencies) for Channel 4 or the sample values of a constant magnitude 5.38 MHz for baseband. The complex ±R and ±I carrier output streams from complex carrier generator 804 are applied as carrier inputs to complex modulator 802, The modulated data-symbol valued complex ±R and ±I output streams from complex carrier generator 804, which occur at the 86.08 MHz sample-frequency rate, are applied as inputs to block 806, which forwards only the ±R output stream to unsigned conversion means 206.

Figure 9:
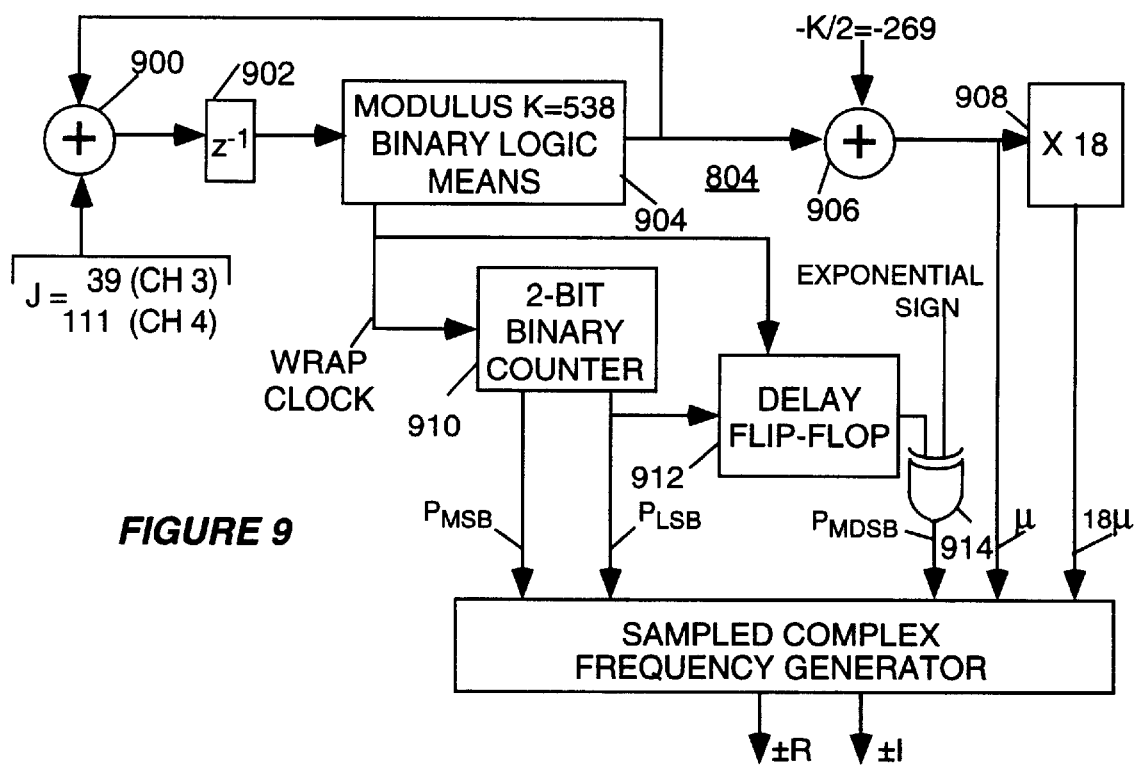
FIGS. 9, 10, and 11 show alternative embodiments of the complex carrier generator of FIG. 8.
Figure 10:
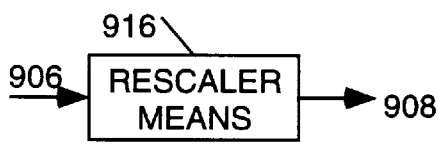
Figure 11:
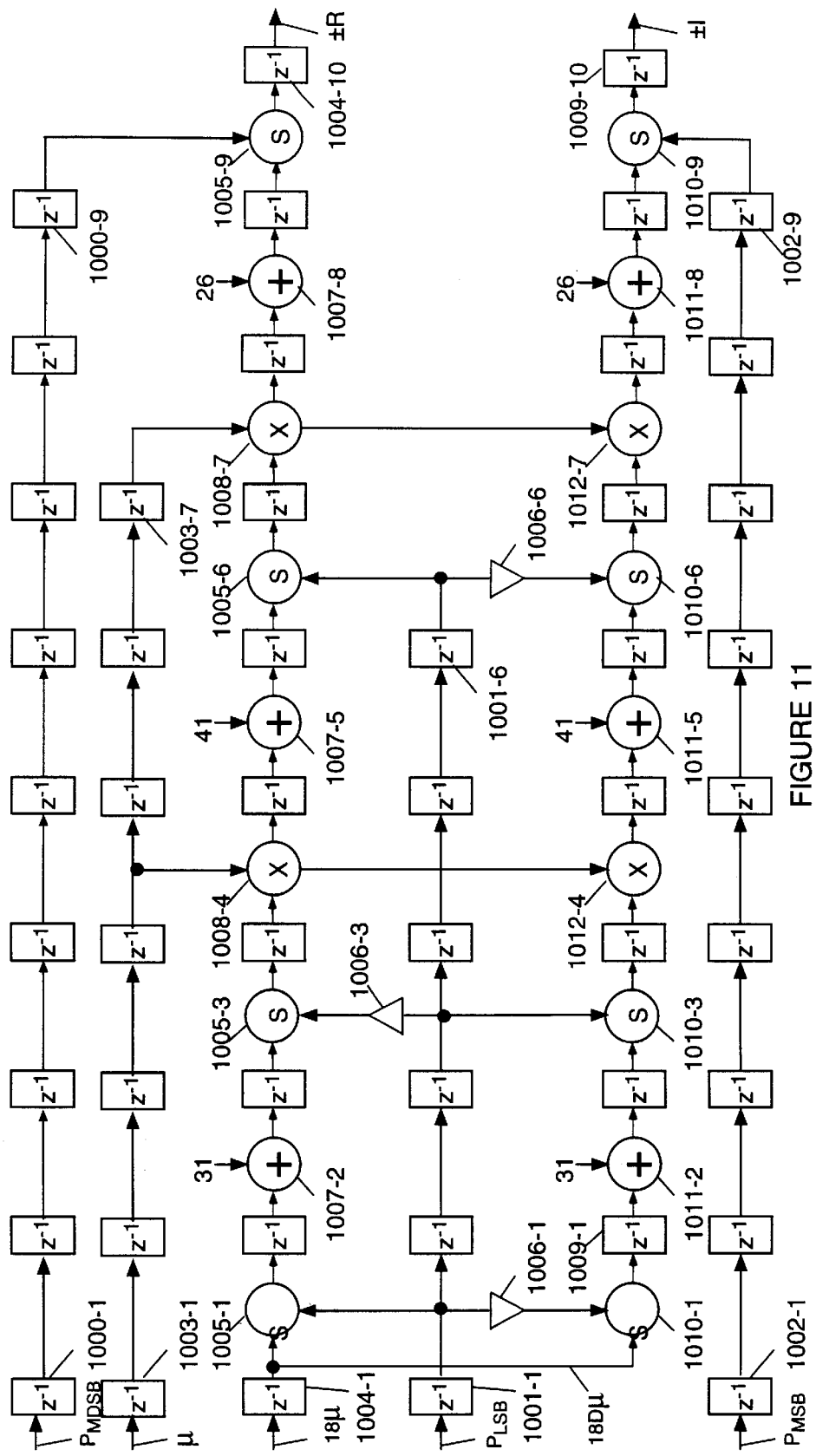

A first structural embodiment of complex generator 804 comprises the sampled complex frequency generator shown in FIG. 11, together with the phase control means shown in FIG. 9 that generates 5 ongoing streams of phase control values that are supplied as inputs to the sampled complex frequency generator of FIG. 11. As shown in FIG. 9, these 5 ongoing streams comprise (1) $\mu$ and $18\mu$ ongoing streams defining phase-control values needed for the generation in FIG. 11 of the phase values of ongoing ±R and ±I streams of a desired sampled sinusoidal frequency $F_0$ (i.e., 1.56 MHz for Channel 3 or 4.44 MHz for Channel 4 occurring at a given (i.e., 86.08 MHz) sample frequency $F_s$ and (2) PLSB, PMSB and MDSB ongoing rectangular timing waveforms also needed by the sampled complex frequency generator of FIG. 11.

Referring to FIG. 9, a constant value J (where J=39 for Channel 3 and where J=111 for Channel 4) is applied as a first addend to first summer 900. Each successive value of a sum output stream from first summer 900, after being delayed by 1 sample period of the given (i.e., 86.08 MHz) sample frequency $F_s$ by latch 902, is applied as an input to modulus K=538 binary logic means 904. Each value of the output stream from logic means 904 is applied both as a second addend to first summer 900 and as a first addend to second summer 906. Whenever the input value to modulus K binary logic means 904 is between 1 and K−1 (where K−1=537), the output value therefrom is equal to that input value, but whenever the input value thereto is higher than K−1 (e.g., K≧538), the output value therefrom is equal to that input value minus K (e.g., K=538). Thus, the combination of J, first summer 900, latch 902 and modulus K binary logic means 904 cooperate to derive an output value from means 904 which increases by the positive value of J each sample period until the positive accumulated value is higher than the positive K value, at which time the positive K value is subtracted from this accumulated value. −K/2 (e.g., −K/2=−269) is applied as a second addend to second summer 906. Therefore, the respective sum values of the output stream from second summer 906, which fall in a range from −269 to +268 and constitute the $\mu$ phase-control input stream to the sampled complex frequency generator shown in FIG. 11, are centered about a 0 value (rather than having all positive values). The respective values of this $\mu$ phase-control input stream, after being multiplied by 18 by block 908, form an output stream that constitutes the 18 $\mu$ phase-control input stream to this sampled complex frequency generator shown in FIG. 11.

Modulus K binary logic means 904 applies a wrap clock as an input to 2-bit binary counter 910 and delay flip-flop 912 each time it subtracts a positive K value from its accumulated value. The respective binary states of the lowest significant bit P$_{LSB}$ and most significant bit P$_{MSB}$ output streams from counter 910 are applied as timing-control input streams to the sampled complex frequency generator shown in FIG. 11. In addition, the P$_{MSB}$ output stream from counter 910 is applied as an input stream to delay flip-flop 912 and the output stream from delay flip-flop 912 is applied to a first input of EXCLUSIVE OR gate 914 and a selected exponential sign value, which corresponds to the desired phase sign of the ±R output stream from the sampled complex frequency generator shown in FIG. 11 relative to the phase sign of the ±I output stream therefrom, is applied to a second input of EXCLUSIVE OR gate 914. The output stream from EXCLUSIVE OR gate 914 constitutes the P$_{MDSB}$ timing-control input stream to the sampled complex frequency generator shown in FIG. 11.

Referring now to FIG. 11, the P$_{MDSB}$ timing-control input thereto is applied to a chain of nine 1 sample-period (e.g., 86.08 MHz period) delay latches 1000-1 to 1000-9; the P$_{LSB}$ timing-control input thereto is applied to a chain of six 1 sample-period delay latches 1001-1 to 1001-6; the P$_{MSB}$ timing-control input thereto is applied to a chain of nine 1 sample-period delay latches 1002-1 to 1002-9; the $\mu$ phase-control input thereto is applied to a chain of seven 1 sample-period delay latches 1003-1 to 1003-7, and the 18$\mu$ phase-control input thereto is applied to an R chain comprising ten 1 sample-period delay latches 1004-1 to 1004-10.

Immediately following each of delay latches 1004-1, 1004-3, 1004-6 and 1004-9 of the R chain is a corresponding one of sign (S) means 1005-1, 1005-3, 1005-6 and 1005-9. The sign value of each of sign means 1005-1 and 1005-6 is determined in accordance with the binary value of the output from corresponding one of delay latches 1001-1 and 1001-6. Due to the presence of inverter 1006-3, the sign value of sign means 1005-3 is determined in accordance with the negative of the binary value of the output from delay latch 1001-3. The sign value of sign means 1005-9 is determined in accordance with the binary value of the output from delay latch 1000-9.

Immediately following each of delay latches 1004-2, 1004-5 and 1004-8 of the R chain is a corresponding one of summers 1007-2, 1007-5 and 1007-8. The value 31 is added by summer 1007-2 to the output value from delay latch 1004-2; the value 41 is added by summer 1007-5 to the output value from delay latch 1004-5, and the value 26 is added by summer 1007-8 to the output value from delay latch 1004-8.

Immediately following each of delay latches 1004-4 and 1004-7 of the R chain is a corresponding one of multipliers 1008-4 and 1008-7. Multiplier 1008-4, which performs the R portion of a first complex exponential modulating function, multiplies the output value from delay latch 1004-4 by the output value from delay latch 1003-4 and multiplier 1008-7, which performs the R portion of a second complex exponential modulating function, multiplies the output value from delay latch 1004-7 by the output value from delay latch 1003-7. The stream of output values from latch 1004-10 of FIG. 11 constitutes the ±R output stream from complex carrier generator 802. It will be recognized by those skilled in the art of digital circuit design that the signal output from the summer 1007-8 is described by a polynomial function of the form $\mp\alpha\mu^3 \mp \beta\mu^2 \pm \kappa\mu+\rho$. In the exemplary circuit of FIG. 11 the values of $\alpha$, $\beta$, $\kappa$ and $\rho$ are 18, 31, 41 and 26 respectively. The last sign circuit 1005-9 in the processing chain merely determines the polarity of the ±R values.

The ±I output stream from complex carrier generator 802 is derived in FIG. 11 by applying the output stream 18$\mu$ from delay latch 1004-1 (i.e., the 18$\mu$ input stream to FIG. 11 delayed by 1 sample period) to an I chain that corresponds with the aforesaid R chain except for the absence of a delay latch corresponding to delay latch 1004-1. Specifically, the I chain comprises delay latches 1009-2 to 1009-10, sign means 1010-1, 1010-3, 1010-6 and 1010-9, summers 1011-2, 1011-5 and 1011-8, and multipliers 1012-4 and 1012-7.

Due to the presence of inverters 1006-1 and 1006-6, the sign value of each of sign means 1010-1 and 1010-6 is determined in accordance with the negative of the binary value of the output from corresponding one of delay latches 1001-1 and 1001-6. The sign value of sign means 1010-3 is determined in accordance with the binary value of the output from delay latch 1001-3. The sign value of sign means 1010-9 is determined in accordance with the binary value of the output from delay latch 1002-9.

Summers 1011-2, 1011-5 and 1011-8 of the I chain perform the same function as summers 1007-2, 1007-5 and 1007-8 of the R chain and multipliers 1012-4 and 1012-7 of the I chain perform the I portion of first and second exponential modulating functions similar to the of first and second exponential modulating functions for the R chain performed by multipliers 1008-4 and 1008-7. The output of the summer 1011-8 may be described by the polynomial function $\pm 18\ \mu^3 \mp 31\ \mu^2 \mp 41\ \mu + 26$. The sign circuit 1010-9 merely determines the polarity f the ±I output signal.

In the operation of the sampled complex frequency generator shown in FIG. 11, the type of wave shape that is generated by the ±R and ±I sampled output streams from this sampled complex frequency generator is determined by the value that multiplies $\mu$, and the respective values of the addends applied to the summers of the R and I chains. In the present case, the respective values 18, which multiplies $\mu$, and 31, 41 and 26, which are the addends applied to the summers of the R and I chains, are minimum alias energy 4-tap interpolation values which define a complex sinusoidal wave shape for the ±R and ±I sampled output streams from this sampled complex frequency generator. However, the generated desired frequency value F$_o$ at a sampling frequency F$_s$ of these ±R and ±I sampled output streams is determined by the successive sampled phase values of the $\mu$ and 18μ input streams applied to FIG. 11 (since frequency is equal to the time rate of change of phase). More specifically, the ratio 4Fo/Fs is equal to the integer ratio of J/K in FIG. 9, so long as Fo/Fs≦¼. Thus, the appropriate desired frequencies −1.56 MHz and −21,52 MHz for deriving a −23.08 MHz pseudo-carrier at a sampling frequency of 86.08 MHz for Channel 3 are generated by a value of 39 for J and a value of 538 for K. Similarly, the appropriate desired frequencies 4.44 MHz and −21,52 MHz for deriving a −17.08 MHz pseudo-carrier at a sampling frequency of 86.08 MHz for Channel 4 are generated by a value of 111 for J and a value of 538 for K. Further, a desired 5.38 MHz baseband carrier Fo is derived for Fs=86.08 MHz by employing an integer value of 269 for J and an integer value of 1076 for K, thereby providing J/K=¼.

Returning to FIGS. 1 and 2, the sampled ±R output stream from multi-scale digital converter 204 of digital VSB modulator 102 defines, inter alia, a selected symbol-modulated pseudo-carrier frequency (e.g. an 8 sample per symbol modulated −17.08 or −23.08 MHz pseudo-carrier frequency or a 5.38 MHz carrier frequency, each of which is sampled at an 86.08 MHz sample-rate frequency). This sampled ±R-valued output stream from multi-scale digital converter 204, after being converted to all positive (+) R-valued output stream by unsigned conversion means 206, is applied as a stream of digital samples to the input of D/A converter 104. The analog output from D/A converter 104 includes a 6 MHz symbol bandwidth signal centered on the image frequency (69 MHz for Channel 4 or 63 MHz for Channel 3) with respect to the sampling-rate frequency (86.08 MHz) of a 6 MHz symbol bandwidth signal centered on the pseudo-carrier frequency (−17.08 or −23.08 MHz) or a 6 MHz symbol bandwidth baseband signal centered on 5.38 MHz. Analog filter 106 has a frequency pass band which passes the 69 MHz centered Channel 4 signal, the 63 MHz centered Channel 3 signal and the 5.38 MHz centered baseband signal, but which rejects both the symbol-modulated −17.08 and −23.08 MHz pseudo-carrier signals.

Figure 12:
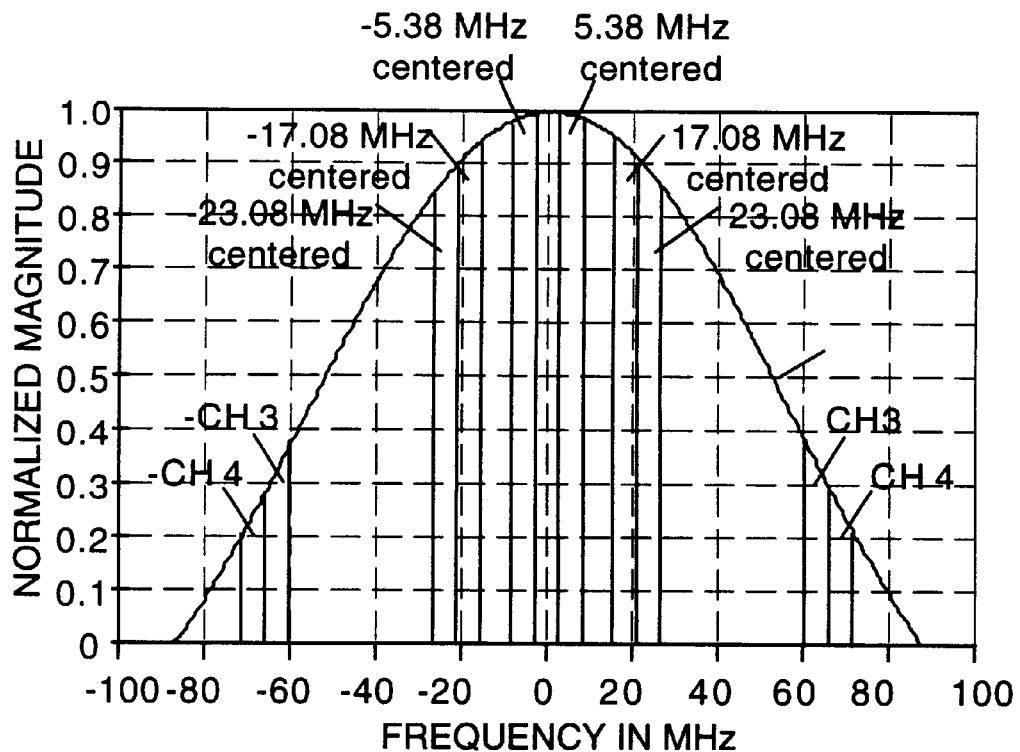
FIGS. 12, 13, 14, 15, 16, 17, 18, 19 and 20 are graphs useful in describing the operation of the digital sinx/x compensation means shown in FIG. 2.
Figure 13:
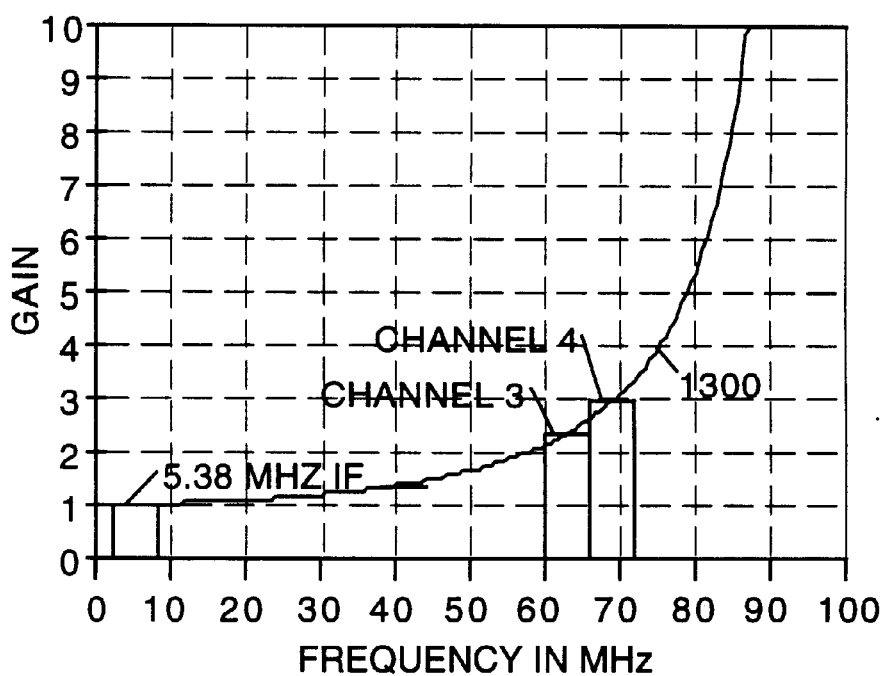

As taught in the aforementioned prior-art U.S. Pat. No. 5,208,596, it is necessary to digitally employ an x/sinx gain factor at the particular frequency or frequency band of a digital signal in order to compensate for the inherent sinx/x roll-off in the analog output magnitude of a D/A converter. In the prior art, this x/sinx gain factor operates on the digital signal immediately prior to it application as an input to the D/A converter. However, this is not practical in the present case because the frequency bands of interest include the 6 MHz bandwidth of the Channel 3 signal (centered on 63 MHz) and the Channel 4 signal (centered on 69 MHz), in addition to the baseband signal (centered on 5.38 MHz), while the digital signal, sampled at an 86.08 MHz sampling-frequency rate, that is applied as an input to D/A converter 104 comprises instead the 6 MHz bandwidth modulated pseudo-carrier −23.08 MHz (i.e., the image of Channel 3) or the 6 MHz bandwidth modulated pseudo-carrier −17.08 MHz (i.e., the image of the Channel 4). In this regard, reference is now made to FIG. 12, which is a graph of the normalized magnitude of sinx/x expression 1200 over a frequency range that extends from −86.08 MHz to 86.08 MHz. Further shown in FIG. 12 is the variable effect of sinx/x expression 1200 on magnitude over the 6 MHz bandwidth centered on the respective frequencies of interest −69 MHz (-Channel 4), −63 MHz (-Channel 3), −23.08 MHz pseudo-carrier, −17.08 MHz pseudo-carrier, −5.38 MHz baseband, 5.38 MHz baseband, 17.08 MHz pseudo-carrier, 23.08 MHz pseudo-carrier, 63 MHz (Channel 3). Only the "slope" of the spectral shape of sinx/x expression 1200 over the 6 MHz bandwidth of each of baseband (centered at 5.38 MHz), Channel 3 (centered at 63 MHz) and Channel 4 (centered at 69 MHz) require a correction x/sinx tilt over their 6 MHz bandwidth in order to become flat (as shown in FIG. 13 by the intersection of x/sin x expression 1300 with the 6 MHz bandwidth of each of Channel 3, Channel 4 and 5.38 MHz IF baseband).

The proper x/sinx gain value for each of the 5.38, 63 and 69 MHz center frequencies is achieved by changing the DC reference magnitude employed by D/A converter 104. However, it is the operation by the digital sinx/x compensation means of the present invention, which occurs prior to the ±R and ±I complex sampled data streams of modulating a carrier, that provides the appropriate x/sinx tilt correction of the spectral-shape "slope" over a 6 MHz bandwidth at the sampling-frequency rate of these sampled data streams. Preferably, as shown in FIG. 2, sinx/x compensation means 202 is located immediately before multi-scale modulator 204 and operates on the samples of 1 sample per symbol ±R and ±I complex DC centered data streams that occur at a sampling-frequency rate of 10.76 MHz.

Sin x/x compensation means 202, operating at a sampling-frequency rate of 10.76 MHz, is capable of performing either a simple, but approximate, linear slope x/sinx tilt correction of the 5.38, 63 or 69 MHz sin x/x spectral-shape over a 6 MHz bandwidth, or a more exact curve-fitting "slope" x/sinx tilt correction of any of these spectral-shapes.

The approximate approach is implemented with the following 3-tap filter, which operates on each of the ±R and ±I complex data input streams to sin x/x compensation means 202 from VSB converter 200:

$$H_{\frac{x}{\sin(x)}}(z) = z^{-1} + \alpha \cdot j \cdot (1 - z^{-2})$$

This filter pre-tilts these ±R and ±I complex data input streams opposite to the "tilt" that the "sin(x)/x" will later be imposed by D/A converter 104. However, that this approximate approach is not a true inverse and results in a parabolic distortion of the "corrected" band. In any case, it is necessary to determine the value of α to use for each of the 5.38, 63 or 69 MHz centered bands in order to make the slope of the pre-tilt filter's frequency response at DC equal to the negative of the sin x/x slope introduced by D/A converter 104. In this regard, reference is made to the following 2 equations:

$$\frac{\frac{\partial}{\partial f}\left(\frac{\operatorname{Sin}\left(\pi \cdot \frac{f}{f_s}\right)}{\pi \cdot \frac{f}{f_s}}\right)}{\left(\frac{\operatorname{Sin}\left(\pi \cdot \frac{f}{f_s}\right)}{\pi \cdot \frac{f}{f_s}}\right)} = -\left[\frac{\partial}{\partial f}\left(1 + \alpha \cdot \left(\varepsilon^{j 2\pi \frac{f}{f_s}} - \varepsilon^{-j 2\pi \frac{f}{f_s}}\right)\right)\right]_{f=0}$$

$$\left(\frac{\pi \cdot \operatorname{Cos}\left(\pi \cdot \frac{f}{f_s}\right)}{f_s \cdot \operatorname{Sin}\left(\pi \cdot \frac{f}{f_s}\right)} - \frac{1}{f}\right) = -\frac{4 \cdot \pi \cdot \alpha}{f_s} \cdot \left[\operatorname{Cos}\left(2 \cdot \pi \cdot \frac{f}{f_s}\right)\right]_{f=0}$$

solving these 2 equations for α yields $$\alpha = \frac{1}{4} \cdot \frac{f_s \cdot \text{Tan}\left(\pi \cdot \frac{f}{f_s}\right) - \pi \cdot f}{\pi \cdot f \cdot \text{Tan}\left(\pi \cdot \frac{f}{f_s}\right)}$$

For the 5.38 MHz centered baseband, the value of α=0.01640467113 (which, with varying precision, can be approximated by 0, 1/64 and 17/1024). For the 63 MHz centered Channel 3 band, the value of α=0.3815501504 (which, with varying precision, can be approximated by 3/8, 49/12 and 97/25624). For the 69 MHz centered Channel 4 band, the value of (α=0.4469876047501504 (which, with varying precision, can be approximated by 7/16, 29/64 and 57/128).

Figure 14:
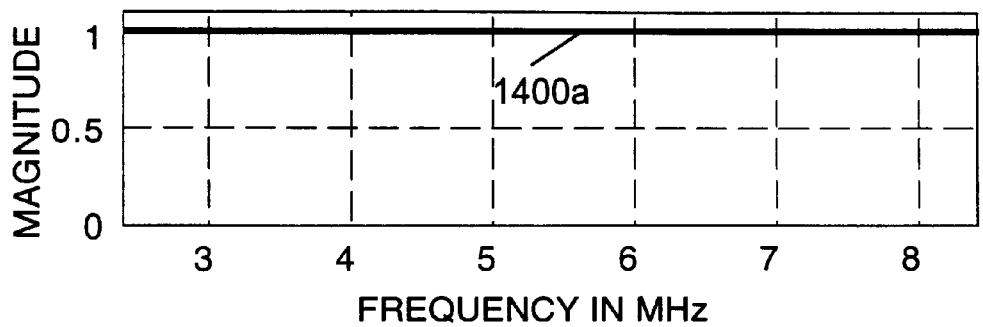
Figure 15:
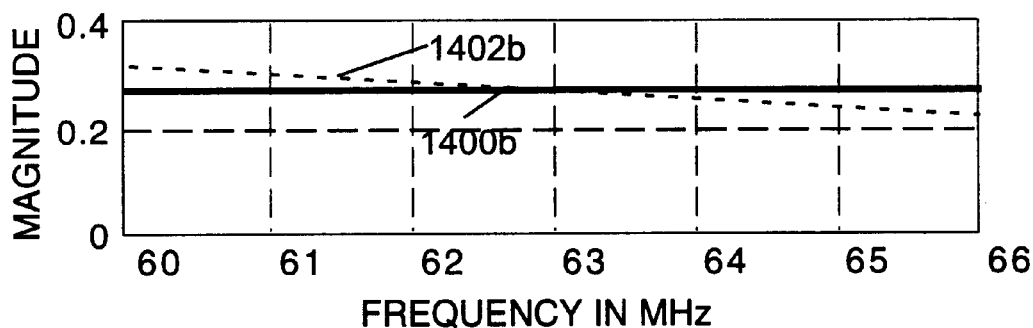
Figure 16:
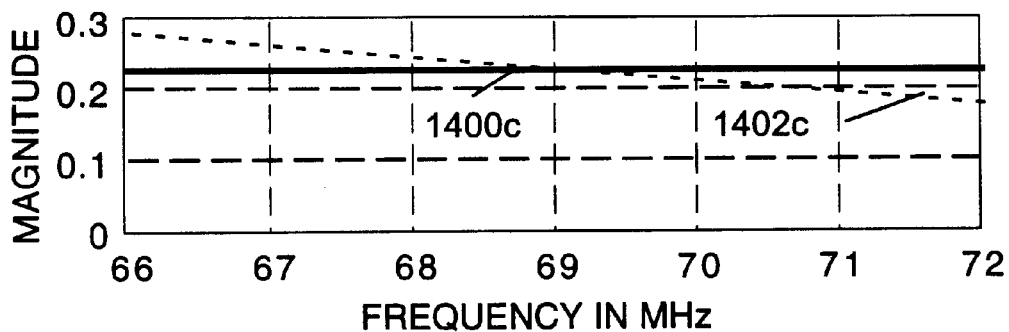

To its relatively coarse α=0 approximation, the 6 MHz bandwidth of the 5.38 MHz centered baseband does not need sin x/x spectral-shape linear slope correction to provide a flat spectral-shape (shown by solid line 1400a of FIG. 14). However, the 6 MHz bandwidth of the 63 MHz centered Channel 3 band sin x/x spectral-shape (shown by dashed line 1402b of FIG. 15) requires a relatively coarse α=⅜ and approximation for linear slope correction to provide a flat spectral-shape (shown by solid line 1400b of FIG. 15). Similarly, the 6 MHz bandwidth of the 69 MHz centered Channel 4 band sin x/x spectral-shape (shown by dashed line 1402c of FIG. 16) requires a relatively coarse α=7/16 approximation for linear slope correction to provide a flat spectral-shape (shown by solid line 1400c of FIG. 16).

Because the actual slope shape of the sin x/x spectral-shape is non-linear, the aforesaid approximate pre-tilt technique is sub-optimal, but is still effective. Specifically, the approximate pre-tilt technique results in distorting the resulting analog signal's root-raised cosine shape, but the television receiver's equalizer can compensate for this remaining impairment.

However, it is a feature of the present invention to also provide a non-linear x/sin x pre-tilt technique for correcting slope shape that virtually matches the non-linear sin x/x slope of the spectral-shape over either the 6 MHz bandwidth of interest of the 63 MHz centered Channel 3 or the 69 MHz centered Channel 4.

In this non-linear x/sin x pre-tilt technique, the x/sin(x) characteristic of D/A converter 104 in the channel to be compensated is decomposed into even and odd symmetric parts about its channel center. The even symmetric part, which is bow-shaped, is matched with a real coefficient even symmetric filter (about DC rather than channel center). The odd symmetric part equals {x/sin(x)/((1–2β)+2βcos(2πf/fs))} and effectively has a residual linear shape across the desired 6 MHz correction bandwidth at 4 or greater samples per symbol (which is more than satisfied by the 8 samples per symbol of the modulated carrier data stream applied to of D/A converter 104). This residual linear shaped odd symmetric part is matched with a complex coefficient odd anti-symmetric filter.

Preferably, filtering in digital sinx/x compensation means 202 by even symmetric filter and odd anti-symmetric filter in cascade occurs at a sampling-frequency rate of 10.76 MHz on the samples of 1 sample per symbol ±R and ±I complex DC centered data stream. At a symbol rate of 10.76 Msym/sec in a channel bandwidth of 6 MHz, compensation takes place over 55% of the unit circle in the z domain($z^{-1}$=$e^{-jwTs}$, Ts=symbol spacing in time). Although the signal being corrected in digital sinx/x compensation means 202 belongs to a particular analog channel (e.g., TV channel 3 or 4), and is being pre-corrected earlier with one sample per symbol processing at a sampling-frequency rate of 10.76 MHz (see FIG. 17 for Channel 3 and FIG. 19 for Channel 4), the effect being cancelled thereby is caused later by D/A converter 104 being clocked at an 8 times higher sampling-frequency rate of 86.08 MHz (see FIG. 18 for Channel 3 and FIG. 20 for Channel 4. Thus, in the latter case, the channel being corrected represents only 7% of the unit circle in the z domain ($z^{-1}$=$e^{-jwTs/8}$, Ts=symbol spacing in time).

The following are the respective impulse responses for the even symmetric filter and odd anti-symmetric filter for use with a sampling frequency rate of 10.76 MHz:

$$H_{ev}(z) = z^{-2} + \beta \cdot \frac{(1 - 9z^{-1} + 16z^{-2} - 9z^{-3} + z^{-4})}{16}$$

and $$H_{odd}(z) = z^{-3} + j \cdot \alpha \cdot \frac{(-2 + 9z^{-1} - 32z^{-2} + 32z^{-4} - 9z^{-5} + 2z^{-6})}{64}.$$

The parameters (α,β) pre-shape the DC centered VSB signal at 1 sample per symbol such that the x/sin x frequency characteristic of D/A converter 104 is corrected for a selected TV channel. For Channel 3, α=71/512 and β=5/256. For Channel 4, α=3/16 and β=9/256.

The following are the respective frequency responses for the even symmetric filter and odd anti-symmetric filter for use with a sampling frequency rate of 10.76 MHz:

$$H_{odd}(F_{MHz}) = 1 + \alpha^* \left(\frac{15}{16} \cdot \sin\left(\frac{50}{269} \cdot \pi \cdot F_{MHz}\right) - \frac{9}{16} \cdot \right.$$

$$\cos\left(\frac{50}{269} \cdot \pi \cdot F_{MHz}\right) \cdot \sin\left(\frac{50}{269} \cdot \pi \cdot F_{MHz}\right) +$$

$$\left. \frac{1}{4} \cdot \sin\left(\frac{50}{269} \cdot \pi \cdot F_{MHz}\right) \cdot \cos\left(\frac{50}{269} \cdot \pi \cdot F_{MHz}\right)^2 \right)$$

and $$H_{ev}(F_{MHz}) = 1 + \beta \cdot \left(\frac{1}{8}\cos\left(\frac{50}{269} \cdot \pi \cdot F_{MHz}\right)^2 - \right.$$

$$\left. 9/16^* \cos\left(\frac{50}{269} \cdot \pi \cdot F_{MHz}\right) + 7/16 \right).$$

Figure 17:
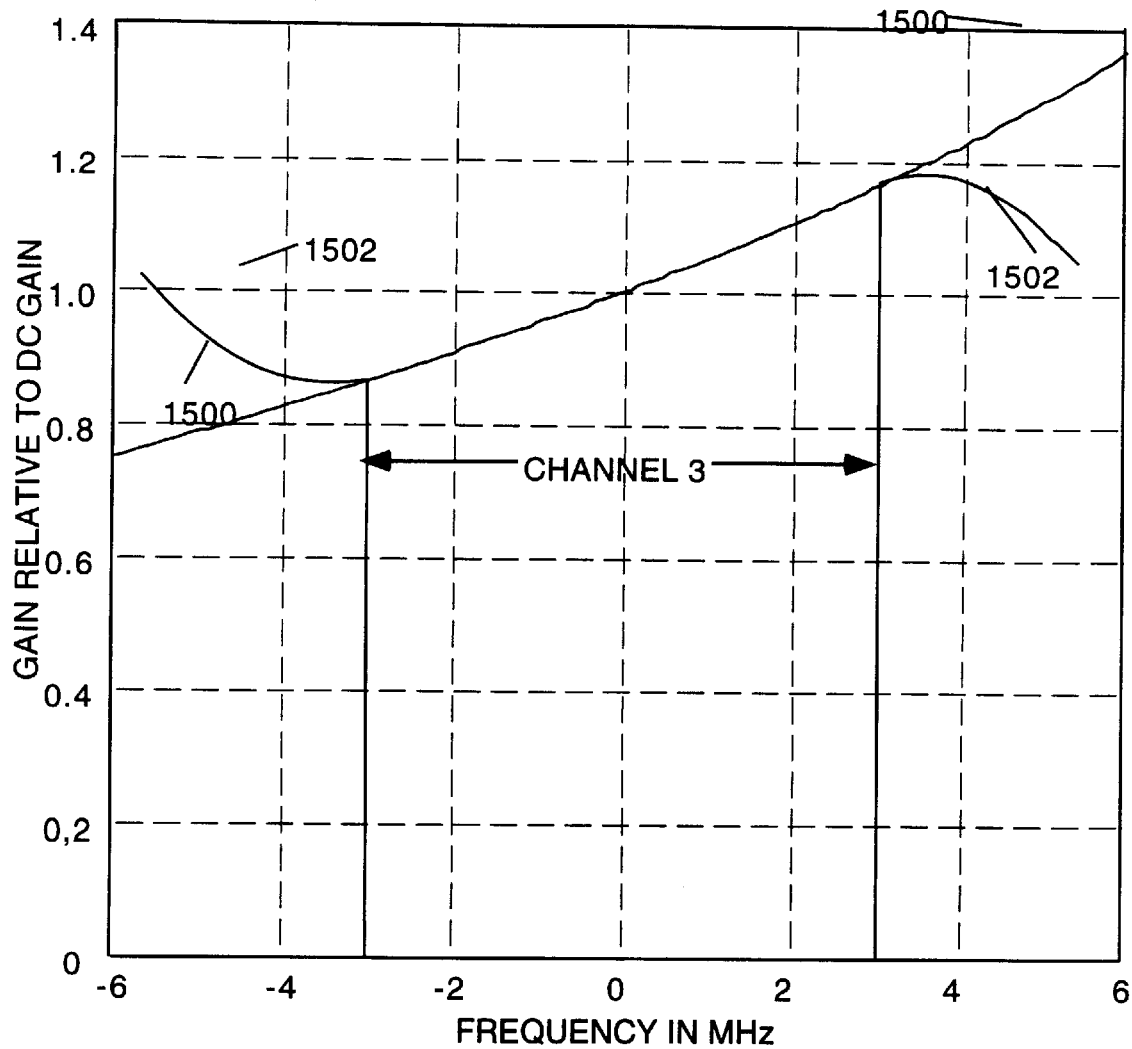
Figure 18:
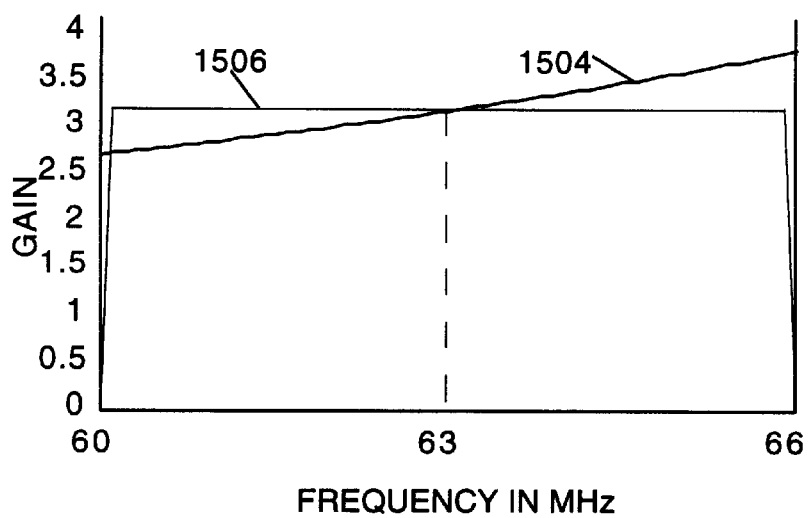

In FIG. 17, 1500 is a plot of the x/sinx function (π*F/86.08)/(sin(π*(F-63)/86.08)) over the −6≦F≦6 MHz frequency interval and 1502 is a plot of the frequency response of the cascaded even and odd filters for Channel 3. It will be seen that plot 1502 coincides with plot 1500 within the 6 MHz bandwidth of Channel 3, but that plot 1502 departs markedly from plot 1500 outside of this the 6 MHz bandwidth of Channel 3. In FIG. 18, 1504 is a plot of the x/sinx function (π*F/86.08)/(sin(π*F/86.08)) over the bandwidth of Channel 3 at the input to D/A converter 104 and 1506 is a plot of the flat output from analog filter 106 after the input to D/A converter 104 has undergone the sin x/x roll-off by D/A converter 104 over the bandwidth of Channel 3.

Figure 19:
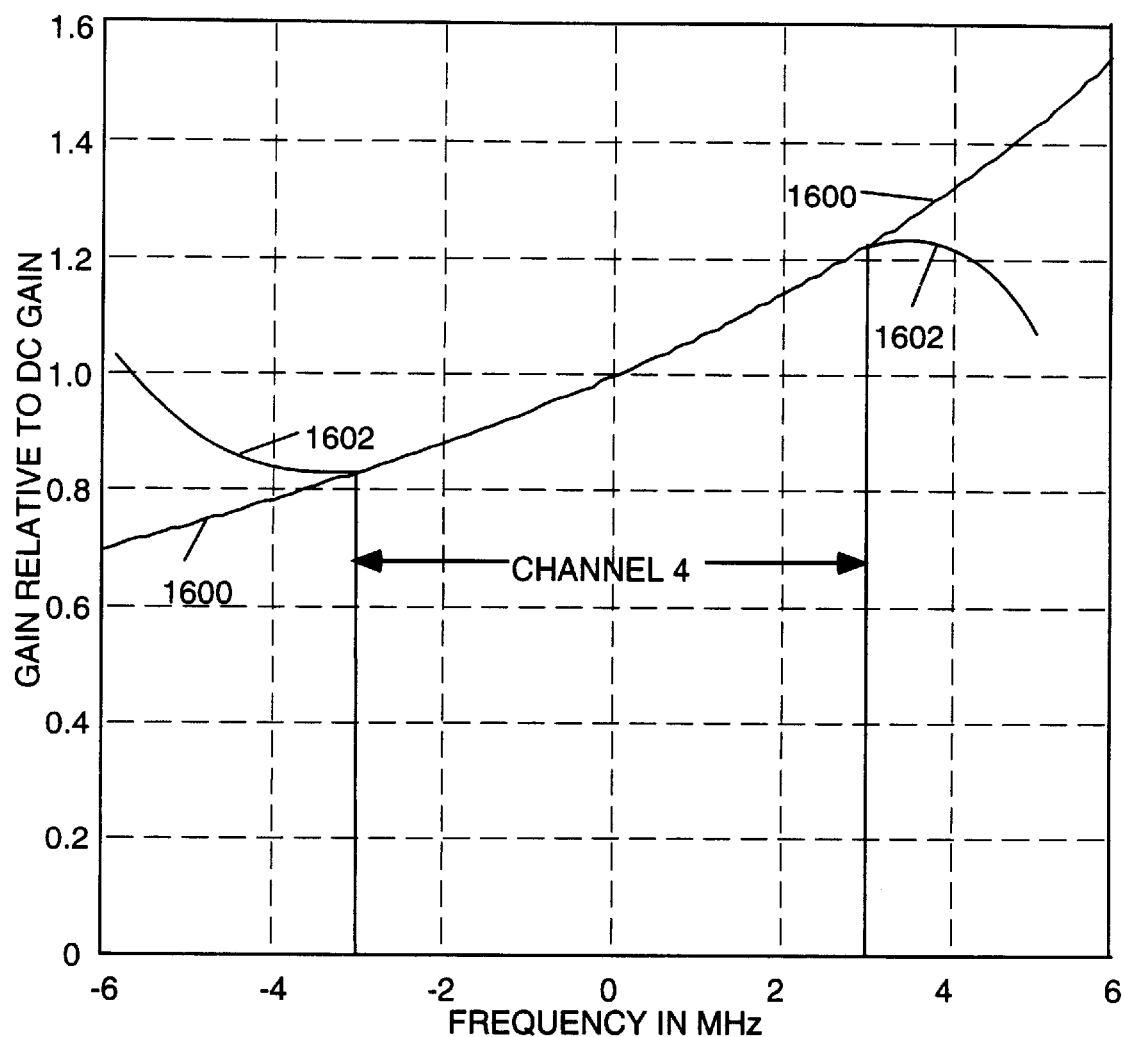
Figure 20:
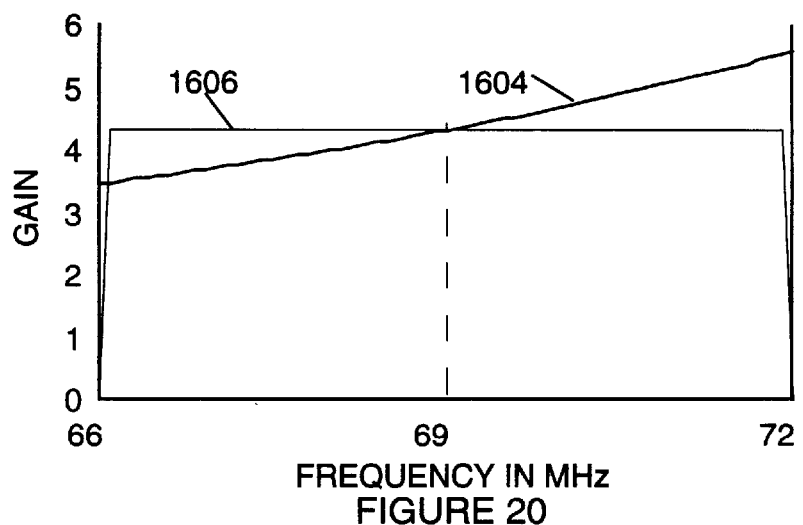
Figure 22:
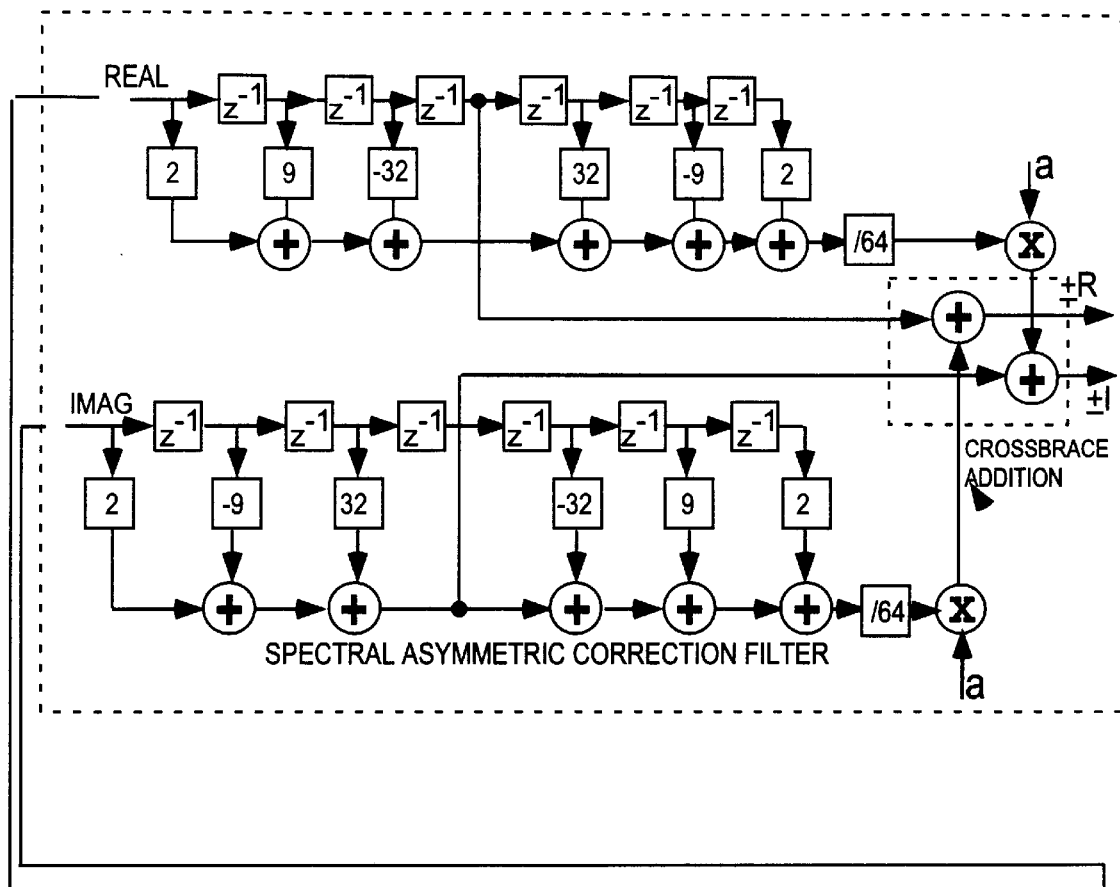
Figure 22:
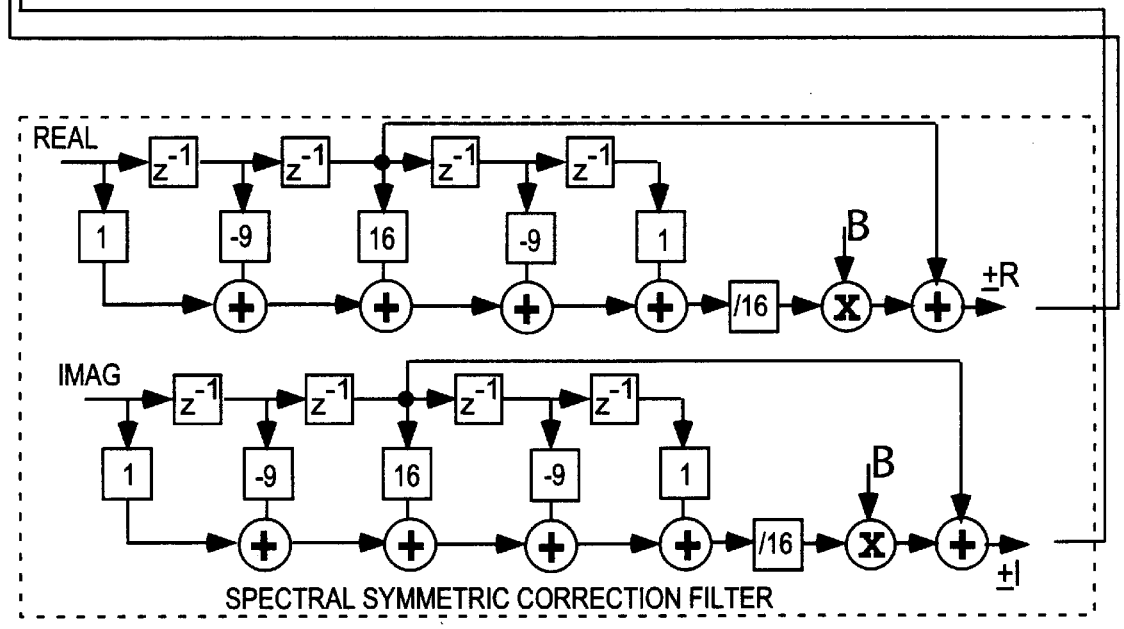

FIG. 19, 1600 is a plot of the x/sinx function (π*F/86.08)/(sin(π*(F-69)/86.08)) over the −6≦F≦6 MHz frequency interval and 1602 is a plot of the frequency response of the cascaded even and odd filters for Channel 4. It will be seen that plot 1602 coincides with plot 1600 within the 6 MHz bandwidth of Channel 4, but that plot 1602 departs markedly from plot 1600 outside of this the 6 MHz bandwidth of Channel 4. In FIG. 20, 1604 is a plot of the x/sinx function (π*F/86.08)/(sin(π*F/86.08)) over the bandwidth of Channel 4 at the input to D/A converter 104 and 1606 is a plot of the flat output from analog filter 106 after the input to D/A converter 104 has undergone the sin x/x roll-off by D/A converter 104 over the bandwidth of Channel 4.

Figure 21:
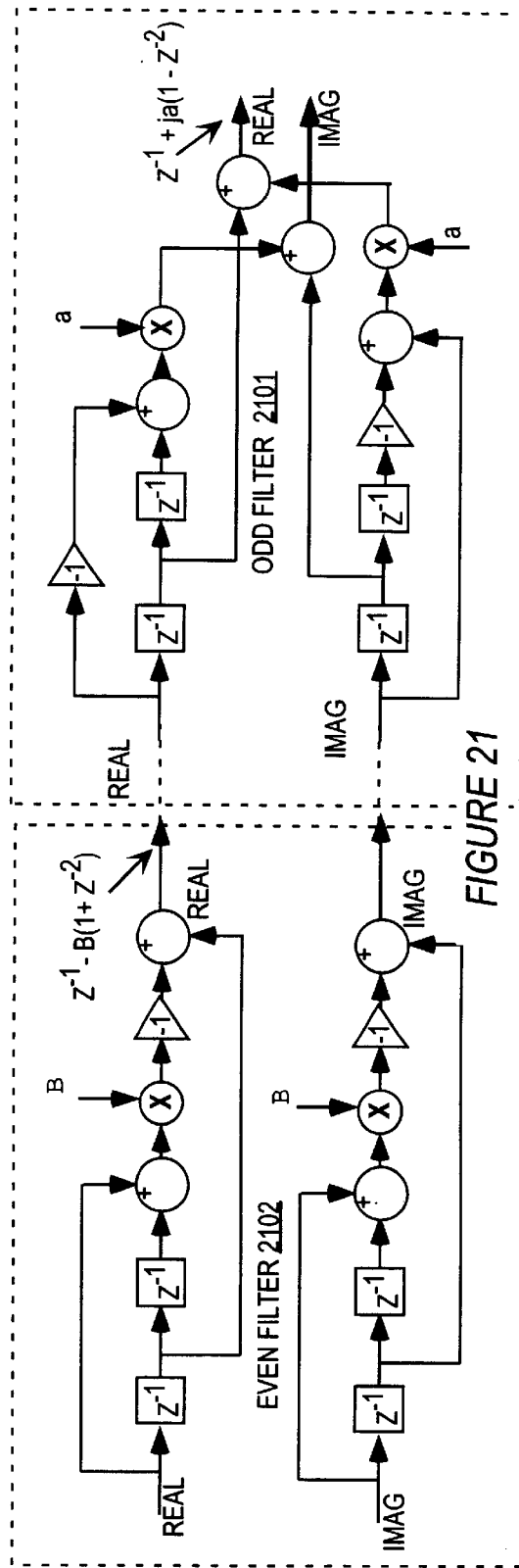
FIGS. 21 and 22 are block diagrams of representative cascaded sinx/x compensating filters.

As long as the x/sin x correction of the slope shape occurs before the ±R and ±I data streams are modulated on a carrier, the correction can be done at any sampling-frequency rate in the system. Thus, in FIG. 8, the x/sin x correction of the slope shape can take place at an 86.08 MHz sampling-frequency rate on the ±R and ±I data stream outputs from 1 sample per symbol to 8 samples per symbol conversion means 800. The same partitioning of correction into a cascade of even symmetric and odd anti-symmetric corrector filters is operative at the higher 86.08 MHz sampling-frequency rate as at the lower 10.76 MHz sampling-frequency rate. However, while operation at the lower 10.76 MHz sampling-frequency rate required 7-tap even and odd filters, operation at the higher 86.08 MHz sampling-frequency rate requires only 3-tap even and odd filters. More specifically, for Channel 3, the impulse response of the 3-tap even filter is $-3/8 +7/4 \cdot z^{-1} -3/8 \cdot z^{-2}$ having a zero delay filter response of $7/4-3/4*\cos(2 \cdot \pi F/F_s)$, while the impulse response of the 3-tap odd filter is $-21/64 \cdot j+z^{-1}+-21/64 \cdot j \cdot z^{-2}$ having a zero delay filter response of $1+21/32*\sin(2 \cdot \pi \cdot F/F_s)$. For Channel 4, the impulse response of the 3-tap even filter is $-3/4+5/2 \cdot z^{-1}-3/4 \cdot z^{-2}$ having a zero delay filter response of $5/2-3/2*\cos(2 \cdot \pi \cdot F/F_s)$, while the impulse response of the 3-tap odd filter is $-29/64 \cdot j+z^{-1}+-29/64 \cdot j \cdot z^{-2}$ having a zero delay filter response of $1+29/32*\sin(2 \cdot \pi \cdot F/F_s)$. Exemplary 3-tap cascaded transversal (FIR) filters are illustrated in FIG. 21, the operation of which will readily be understood by those skilled in digital circuit design.

However, it is more efficient, in terms of the number of operations per unit time, to employ higher 7-tap cascaded even and odd filters operating at a lower 10.76 MHz sampling-frequency rate than to employ lower 3-tap cascaded even and odd filters operating at a higher 86.08 MHz sampling-frequency rate.

Further, digital sinx/x compensation means 202 incorporates a mux, similar in operation to above-described mux 311 of VSB converter 200, to cause all computed x/sinx values that are real to be forwarded as the ±R data output stream therefrom and all computed x/sinx values that are imaginary to be forwarded as the ±I data output stream therefrom.

In a practical hardware implementation of digital VSB modulator 102, complement of 2 binary code was employed to effect all computations. Further, while all of the many above-described features of the present invention are incorporated in digital VSB modulator 102, it should be understood that a sub-set of one or more of these inventive features may find general utility in various types of apparatus that are different from digital VSB modulator 102. Therefore, it is intended that the present invention be limited only by the scope of the appended claims.

What is claimed is:

1. In circuitry including a digital modulator coupled to a digital to analog converter, said digital to analog converter having an undesired sin(x)/x transfer function, and said modulator having an input for applying a sampled digital modulating signal, apparatus comprising:
    a source of sampled digital modulating signal having a given frequency band;
    sin(x)/x compensating circuitry, coupled between said source and said modulator input, for compensating a portion of the frequencies of signal provided by said digital to analog converter corresponding to said given band of frequencies, wherein the transfer function of the compensating circuitry produces a substantially flat frequency response across said portion of frequencies.

2. The apparatus set forth in claim 1 wherein said sin(x)/x compensating circuitry has a transfer function corresponding to cascade coupled transversal filters having first and second transfer functions which in cascade provide a predetermined compensating function.

3. The apparatus set forth in claim 2 wherein said digital modulator is a complex digital modulator and said transversal filters are an N tap real filter exhibiting spectral symmetry and an M tap complex filter exhibiting spectral anti-symmetry, where M and N are integers.

4. In a system including a digital modulator coupled to a digital to analog converter, said digital to analog converter having an undesired sin(x)/x transfer function, and said modulator having an input for applying a sampled digital modulating signal, a method of compensating said undesired transfer function comprising:
    providing a stream of data sample values representing a signal having a given band of frequencies;
    sin(x)/x compensating said stream of data sample values;
    applying compensated said stream of data sample values to an input of said digital modulator; and
    wherein for the portion of the frequencies of the modulated signal provided by said digital to analog converter corresponding to said given band, the sin(x)/x compensating step produces a substantially flat frequency response across said band.

5. The method set forth in claim 4 wherein the step of sin(x)/x compensating comprises filtering said stream of data sample values with a transfer function corresponding to cascade connected spectrally symmetric and anti-symmetric transversal filters, at least one of which is a complex filter.

6. In apparatus including a digital-to-analog (D/A) converter and digital-processor including a digital modulator for applying, as an input to said D/A converter, a sampled stream of sample values defining a given carrier-frequency that has been modulated by a sampled data stream of data sample values over a given frequency bandwidth having been applied as a modulating input to said digital modulator, whereby said D/A converter inherently introduces a sin x/x roll-off as a function of frequency in the magnitude of an analog signal derived as an output therefrom; said digital-processor further comprising:
    a digital sin x/x compensator, having an output coupled to an input of said digital modulator and operating on said sampled stream of data sample values, for modifying the shape of said sampled stream of data sample values over said given frequency bandwidth whereby the magnitude response for each frequency within said given frequency bandwidth of said derived analog signal is substantially equal to the magnitude response of that frequency on which said derived analog signal is centered.

7. The apparatus defined in claim 6, wherein:
    said sampled stream of sample values defining said given carrier-frequency is sampled at a rate of a given sampling frequency; and
    said given carrier frequency, with respect to said given sampling frequency, is an image of that frequency on which said analog signal is centered.

8. The apparatus defined in claim 7, wherein:
    said digital modulator is a complex digital modulator;
    said complex digital modulator has been modulated by DC-centered complex real (±R) and imaginary (±I) sampled data streams of data sample values over said given frequency bandwidth, which ±R and ±I sampled data streams occur at a rate of said given sampling frequency and are modified in shape in accordance with a particular x/sin x function.

9. The apparatus defined in claim 8, wherein said digital sin x/x compensator comprises:

a 3-tap filter responsive to the application thereto, at a rate of a sampling frequency fs of each one of certain DC-centered complex ±R and ±I sampled data streams of data sample values defining any frequency f within the band of said given frequency bandwidth of said analog signal, wherein said filter has a frequency response of the form:

$$H_{\frac{x}{\sin(x)}}(z) = z^{-1} + \alpha \cdot j \cdot (1 - z^{-2}), \text{ where}$$

$$\alpha = \frac{1}{4} \cdot \frac{f_s \cdot \text{Tan}\left(\pi \cdot \frac{f}{f_s}\right) - \pi \cdot f}{\pi \cdot f \cdot \text{Tan}\left(\pi \cdot \frac{f}{f_s}\right)};$$

whereby the slope of data signal magnitude as a function of frequency is linearly pre-tilted by an amount that depends on the value of fs, the value of f over the frequencies of said given frequency bandwidth of said analog signal and the precision with which the value of α is defined, where "α" is a constant, "z" represents the ZEE transform variable, "f" is signal frequency "j" is the imaginary operator and "fs" is sample frequency;
whereby said pre-tilted slope conforms to a shape of said particular x/sin x function.

10. The apparatus defined in claim 9, wherein:

α:=3/18
said given frequency bandwidth is substantially 6 MHz;
said given sampling frequency is substantially 86.08 MHz; and
said given carrier is complex having a frequency that is substantially −23.08 MHz;
whereby said analog signal constitutes a Channel 3 television signal centered on 63 MHz and which has a substantially flat magnitude response over its 6 MHz bandwidth.

11. The apparatus defined in 9, wherein:

α=7/16
said given frequency bandwidth is substantially 6 MHz;
said given sampling frequency is substantially 86.08 MHz; and
said given carrier is complex having a frequency that is substantially −17.08 MHz;
whereby said analog signal constitutes a Channel 4 television signal centered on 69 MHz which has a substantially flat magnitude over its 6 MHz bandwidth.

12. The apparatus defined in claim 8, wherein said sampled stream of sample values applied as an input to said D/A converter comprises at least 4 sample values per symbol and a portion of derived analog signal over its given frequency bandwidth has a non-flat shape about said center frequency of said derived analog signal, and wherein said digital sin x/x compensator comprises:

cascaded spectrally symmetric and anti-symmetric filters, wherein said symmetric filter has a first given frequency characteristic and said anti-symmetric filter has a second given frequency characteristic which in cascade produce said particular x/sin x function of frequency.

13. The apparatus defined in claim 12, wherein:

said digital sin x/x compensator operates on at least 4 samples per symbol ±R and ±I sampled data streams applied as inputs thereto that occur at a rate of said given sampling frequency;

said symmetric filter comprises a 3-tap real filter having said first given frequency characteristic determined by its impulse response and its zero delay filter response; and said anti-symmetric filter comprises a 3-tap complex filter having said second given frequency characteristic determined by its impulse response and its zero delay filter response.

14. The apparatus defined in claim 13, wherein said digital sin x/x compensator operates on 8 samples per symbol and:

said given frequency bandwidth includes any frequency f within a band of substantially 6 MHz;
said given sampling frequency fs is substantially 86.08 MHz;
said given carrier is complex having a frequency that is substantially −23.08 MHz;
said 3-tap symmetric filter has an impulse response of the form $-A + B \cdot z^{-1} - A \cdot z^{-2}$;
said 3-tap anti-symmetric filter has an impulse response of the form $-C \cdot j + z^{-1} + -C \cdot j \cdot z^{-2}$; and
where A, B and C are constants, "z" represents the ZEE transform variable, and "j" is the imaginary operator; and
said analog signal constitutes one of Channel 3 and Channel 4 television signals centered on one of 63 and 69 MHz respectively and which has a substantially flat magnitude over its 6 MHz bandwidth.

15. The apparatus defined in claim 12, wherein said digital-processor further comprises:

sample rate conversion means for converting 1 sample per symbol ±R and ±I sampled data streams occurring at a rate of a given sub-harmonic of said given sampling frequency applied as inputs thereto to at least 4 samples per symbol of said ±R and ±I sampled data streams occurring at said rate of said given sampling frequency which are applied as modulating inputs to said complex digital modulator;

1 sample per symbol ±R and ±I sampled data streams occurring at said rate of said given sub-harmonic of said given sampling frequency are applied as inputs to said cascaded even and odd filters of said digital sin x/x compensator; and 1 sample per symbol ±R and ±I sampled output data streams occurring at said rate of said given sub-harmonic of said given sampling frequency from said cascaded even and odd filters of said digital sin x/x compensator are applied as said ±R and ±I sampled data streams applied as inputs to said sample rate conversion means.

16. The apparatus defined in claim 15, wherein:

said sample rate conversion means converts said 1 sample per symbol ±R and ±I sampled data streams to 8 samples per symbol of said ±R and ±I sampled data streams which are applied as modulating inputs to said complex digital modulator;

said given frequency bandwidth includes any frequency within a band of substantially 6 MHz;

said given sampling frequency is substantially 86.08 MHz and said given sub-harmonic is substantially 10.76 MHz;

said given carrier frequency is substantially −23.08 MHz;
α=71/512; and
β=5/256;
whereby said analog signal constitutes a Channel 3 television signal centered on 63 MHz which has a substantially flat magnitude over its 6 MHz bandwidth.

* * * * *